United States Patent [19]

Tanaka

[11] Patent Number: 5,265,061
[45] Date of Patent: Nov. 23, 1993

[54] APPARATUS FOR PREVENTING GLITCH FOR SEMICONDUCTOR NON-VOLATILE MEMORY DEVICE

[75] Inventor: Sumio Tanaka, Tokyo, Japan
[73] Assignee: Kabushiki Kaisha Toshiba, Kawasaki, Japan
[21] Appl. No.: 943,145
[22] Filed: Sep. 10, 1992

Related U.S. Application Data

[63] Continuation of Ser. No. 511,770, Apr. 20, 1990, abandoned.

[30] Foreign Application Priority Data

Apr. 27, 1989 [JP] Japan ................... 1-108702

[51] Int. Cl.$^5$ .............. G11C 7/00; G11C 11/40; H03K 19/003; H03K 19/0175
[52] U.S. Cl. ................. 365/210; 365/189.06; 365/233; 307/443; 307/465; 307/542
[58] Field of Search ............... 365/185, 206, 189.06, 365/194, 198, 204, 210, 230.06, 233, 233.5, 207, 208; 307/443, 465, 542

[56] References Cited

U.S. PATENT DOCUMENTS

| | | | |
|---|---|---|---|
| 4,340,943 | 7/1982 | Asano et al. | 365/194 |
| 4,819,212 | 4/1989 | Nakai et al. | 365/210 |
| 4,866,677 | 9/1989 | Sakurai | 365/189.04 |
| 4,903,238 | 2/1990 | Miyatake et al. | 365/189.06 |
| 4,982,364 | 1/1991 | Iwahashi | 365/189.09 |
| 5,136,186 | 8/1992 | Trinh et al. | 307/443 |

Primary Examiner—Joseph L. Dixon
Assistant Examiner—Jack A. Lane
Attorney, Agent, or Firm—Banner, Birch, McKie & Beckett

[57] ABSTRACT

A semiconductor non-volatile memory device having non-volatile memory cells for storing binary data, a plurality of column lines respectively connected to the plurality of memory cells and a plurality of row lines respectively connected to the plurality of memory cells comprising a plurality of dummy cells, having the same structure as the memory cells, respectively connected to the column lines and arranged to be set in an ON state upon being selected, a dummy row line connected to the plurality of dummy cells, a dummy row line selector for selecting the dummy row line for a predetermined period in response to a chip selection signal for selecting the memory device. Therefore, since the dummy row line is selected for the predetermined period before the memory device is selected by a computer system or the like, each of the column lines is set at a ground potential by a dummy memory cell set in an ON state. During a transition from the non-selected state to a selected state of the memory device, in synchronism with the transition from the non-selected state to the selected state of a target memory cell in a plurality of memory cells, the state of a dummy cell connected to the target memory cell transits from the selected state to the non-selected state.

16 Claims, 6 Drawing Sheets

APPARATUS FOR PREVENTING GLITCH FOR SEMICONDUCTOR NON-VOLATILE MEMORY DEVICE

This application is a continuation of application Ser. No. 07/511,770, filed Apr. 20, 1990, now abandoned.

BACKGROUND OF THE INVENTION

1. Field of the Invention

The present invention relates to a semiconductor non-volatile memory device and, more particularly, to a technique for preventing the occurrence of a glitch of level "1"→level "0"→level "1" in a read data output during a transition from a non-selected state to a selected state in a memory device.

2. Description of the Related Art

A conventional Read Only Memory (ROM) such as a ROM using an n-channel Metal Oxide Semiconductor Field Effect Transistor (MOS FET) is arranged in the following manner, as is well known. That is, as for rows, a ROM comprises a row decoder for decoding a row address, a plurality of row lines connected to each of the outputs of the row decoder and a plurality of non-volatile memory cells whose gates are connected to the row lines. Regarding columns, the ROM comprises a column decoder for decoding a column address, a plurality of column lines connected to each of the outputs of the column decoder and the plurality of non-volatile memory cells whose drains and sources are respectively connected to the column lines and a signal ground. Note that binary data can be stored by charging a floating gate or changing the shape of the n-channel MOS FET pattern. In addition, the ROM includes a sense amplifier for detecting and amplifying a small voltage indicating the storage data from the non-volatile memory cell and a buffer amplifier for current-amplifying the output from the sense amplifier. In the sense amplifier or the buffer amplifier, data read out from the memory cell is usually inverted.

In the conventional ROM, row lines are normally made of polysilicon, a polycide or the like, and column lines are normally made of Al. Therefore, it takes time from when a row selection signal is generated at an output of a row decoder to when the output signal is transmitted to a memory cell connected to a row line end. This is because the signal is delayed by resistance and capacitance components of the polysilicon or polycide of the signal line. By this signal delay, a column line connected to the drain of a memory cell connected near the row line end is electrically floated, and a glitch (such as a noise of 10 nS to 20 nS) of level "1"→level "0"→level "1" may occur at a buffer output.

Figure 1:
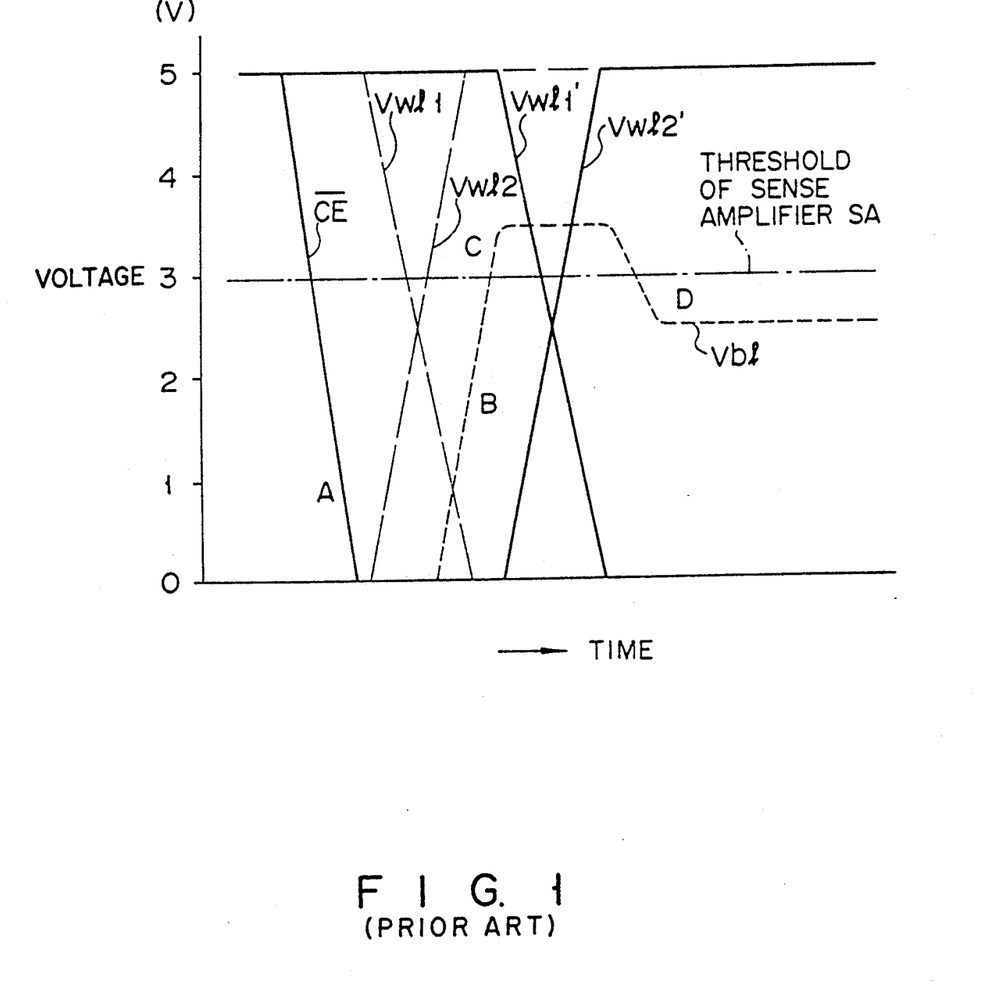
FIG. 1 is a graph showing a waveform of a read operation of a conventional ROM.
Figure 2:
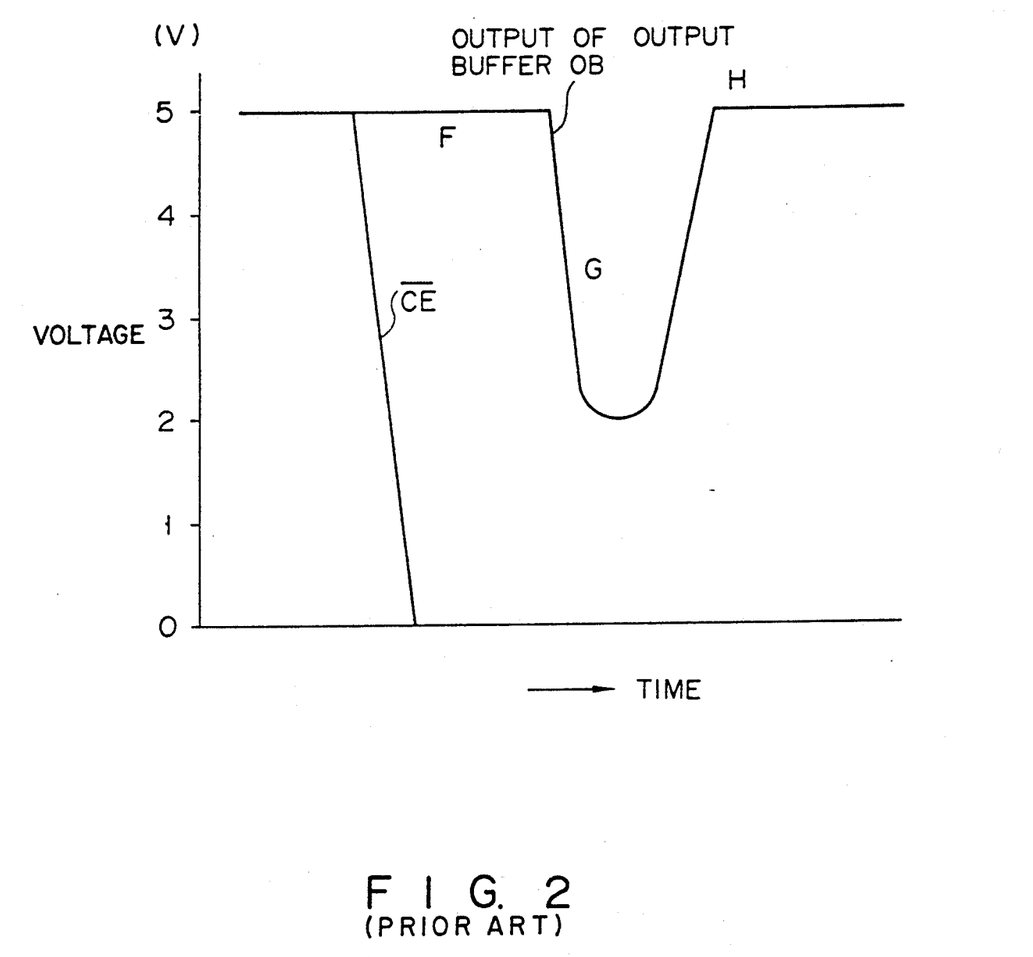
FIG. 2 is a graph showing a waveform of an output potential of an output buffer upon the read operation in FIG. 1.

A cause of the glitch will be described with reference to FIGS. 1 and 2. FIG. 1 shows voltages at both ends of a row line (Vwl1, Vwl1'), a chip selection signal ($\overline{CE}$) and an output of a selected memory cell (Vbl). Referring to FIG. 1, reference symbols Vwl1 and Vwl1' denote voltage levels on the row decoder side and the cell side connected to an end of the row line selected before selection of the chip; and Vwl2 and Vwl2', voltage levels on a row decoder side and a cell side connected to an end of a row line selected after selection of the chip, respectively. Reference symbol Vbl indicated by a broken line denotes a voltage level of the same column line selected before/after selection of the chip. FIG. 2 shows an output of a ROM chip in the operation in FIG. 1.

In this case, when the ROM chip is not selected, it is assumed that the row and column decoders select a memory cell which is connected to an end of a row line and set in an OFF state (that is, an output of the cell is set at high level when the cell is selected). Furthermore, it is assumed that a period of non-selection of the ROM chip is longer than that of a memory cycle. When the period of non-selection of the ROM chip becomes longer than that of the memory cycle, a potential of a column line is decreased to a ground potential by a junction leakage current of each cell connected to the column line. It is assumed that when this ROM chip is selected by a computer system, a memory cell is set in an ON state (that is, an output of the cell is set at low level when the cell is selected) and connected to the same column line as before it is selected.

When a chip selection signal is set at a low level (A in FIG. 1) and the chip is selected, a potential Vbl of the column line is immediately output from this chip (F in FIG. 2). That is, the low-level potential of the column line is inverted by the amplifier, and a high-level potential is generated at the output of the chip. A row selection signal is transmitted to the gate of the target memory cell with a delay due to the above-described reason (Vwl1, Vwl1', Vwl2, and Vwl2' in FIG. 1). During this delay period, the output of the memory cell selected in advance is set in a floating state, and a current controlled by the chip selection signal is supplied from the power source to the column line connected to the cell. Therefore, the potential of the column line is increased (B in FIG. 1) over a threshold value of the sense amplifier (C in FIG. 1), and an inverted low-level potential is generated at the chip output (G in FIG. 2). Before long, the row selection signal reaches the gate of the memory cell located at the end of the memory cell array. Since the target memory cell is set in an ON state according to the above assumption, the column line is set at low level (D in FIG. 1). Therefore, an inverted high-level potential is generated at the chip output (H in FIG. 2). Thus, a glitch of level "1"→level "0"→level "1" occurs at the chip output (i.e., a buffer amplifier OB output).

Upon generation of such a glitch, a variation in power source voltage (self noise) caused by a change in output current of the buffer amplifier OB is larger than that caused by a change in normal read data output such as level "1"→level "0" or level "0"→level "1". This is because power source noise (i.e., a variation in power source voltage) is induced by the rapid change in output current such as a glitch. This variation in power source voltage causes degradation of the operation margin of an address input buffer or an error in its operation. Furthermore, the operation error of the address input buffer causes, in turn, a glitch in the output. This may cause oscillation of the memory. The same problem is encountered in other types of ROMs.

SUMMARY OF THE INVENTION

It is an object of the present invention to provide a semiconductor non-volatile memory device capable of preventing the occurrence of a glitch of level "1"→level "0"→level "1" in a read data output during a transition from a non-selected state to a selected state in a memory device.

In order to achieve the object, a semiconductor non-volatile memory device comprises non-volatile memory cells for storing binary data, a plurality of column lines respectively connected to the plurality of memory cells, a plurality of row lines respectively connected to the plurality of memory cells, a plurality of dummy cells which are respectively connected to the column lines, arranged to be set in an ON state upon being selected and have the same structure as the memory cell, a dummy row line connected to the plurality of dummy cells, and a dummy row line selector means for selecting the dummy row line for a predetermined period in response to a chip selection signal for selecting the memory device.

According to the present invention, since the dummy row line is selected for the predetermined period before selection of the memory device, each column line is set at a ground potential by a corresponding dummy memory cell set in an ON state. During a transition from a non-selected state to a selected state of the memory device, in synchronism with the transition from the non-selected state to the selected state of a target memory cell selected from a plurality of memory cells, the state of the dummy cell connected to the selected memory cell transits from the selected state to the non-selected state. Therefore, since a potential of a target column line is held at the ground potential until the target memory cell is actually selected, the target column line is prevented from being transiently set in a floating state. In addition, since the dummy cell is set in the non-selected state upon selection of the memory cell, the present invention does not prevent a memory cell selection operation. Since a potential of a column line connected to the selected memory cell is set at low or high level according to storage data of the selected memory cell from the ground potential, a glitch of level "1"→level "0"→level "1" does not occur in the read data output.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will be described below with respect to the accompanying drawings.

Figure 3:
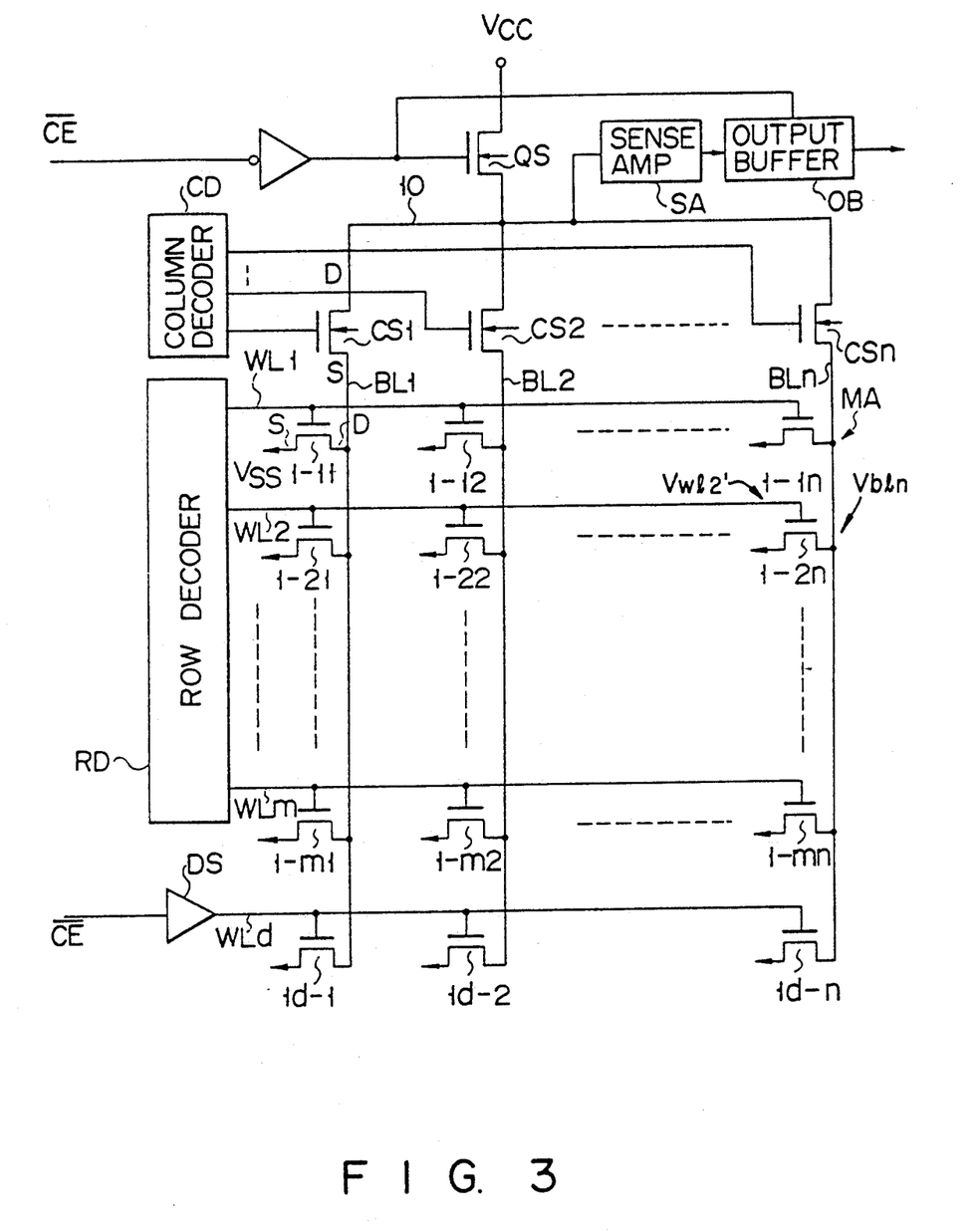
FIG. 3 is a view for explaining a part of an arrangement of a ROM according to an embodiment of the present invention.

FIG. 3 shows a part of a mask ROM as an example. That is, reference symbols 1-11 to 1-mn denote ROM cells arranged in a matrix form of m rows×n columns. Each of the cells is, e.g., an n channel MOS transistor whose source is connected to a ground potential Vss. Binary data is stored in each cell so that, e.g., a floating gate (not shown) is charged or not. That is, the threshold potential of the gate is set according to data "0" or "1" stored in the cell. Reference symbols 1d-1 to 1d-n denote n-channel transistors which are n dummy (i.e., additional) cells arranged to be set in an ON state upon being selected.

In a ROM arranged by adding dummy cells 1d-1 to 1d-n to a memory cell array MA consisting of ROM cells 1-11 to 1-mn arranged in a matrix form, WL1 to WLm and WLd denote row lines and a dummy row line commonly connected to the gates of ROM cells arranged in the same row line, respectively. Reference symbols BL1 to BLn denote column lines commonly connected to the drains of ROM cells arranged in the same column line. The gates of the n dummy cells are connected to the dummy row line WLd, and their drains are respectively connected to the column lines BL1 to BLn. Reference symbol DS denotes a buffer in which a chip selection signal/CE is input and current-amplified to be output to the dummy row line. That is, the buffer DS is a dummy row line selector for selecting the dummy row line WLd and the dummy cells 1d-1 to 1d-n for a predetermined period (i.e., period in which the ROM chip is not selected). Reference symbol RD denotes a row decoder for selecting any one of the row lines WL1 to WLm according to a row address input. Reference symbols CS1 to CSn denote column selection transistors whose sources are respectively connected to the column lines BL1 to BLn and whose drains are connected to each other. Reference symbol CD denotes a column decoder for selecting any one of the column selection transistors according to a column address input. The outputs of the CD are connected to the gates of the column selection transistors CS1 to CSn, respectively.

An n-channel MOS transistor QS controlled to be in an ON/OFF state by the chip selection signal/CE supplied to its gate is connected between a power source Vcc (e.g., 5 V) and a common column line 10 (common connecting point) of the column selection transistors CS1 to CSn. The common column line 10 is connected to the input of a sense amplifier for detecting and voltage-amplifying a signal read out from the cell. Reference symbol OB denotes a data output buffer amplifier, connected to the output of the sense amplifier SA, for buffer-amplifying (i.e., current-amplifying) the sense amplifier output. At this time, it is assumed that a read data output is inverted to level "0" (low level) or level "1" (high level) in accordance with high/low level of the potential of the selected column line. That is, this ROM is arranged so that 1 (row)×n (column) dummy memory cells 1d-1 to 1d-n and the buffer DS are connected to the memory cell array MA constituted by m (row)×n (column) ROM cells 1-11 to 1-mn.

Figure 4:
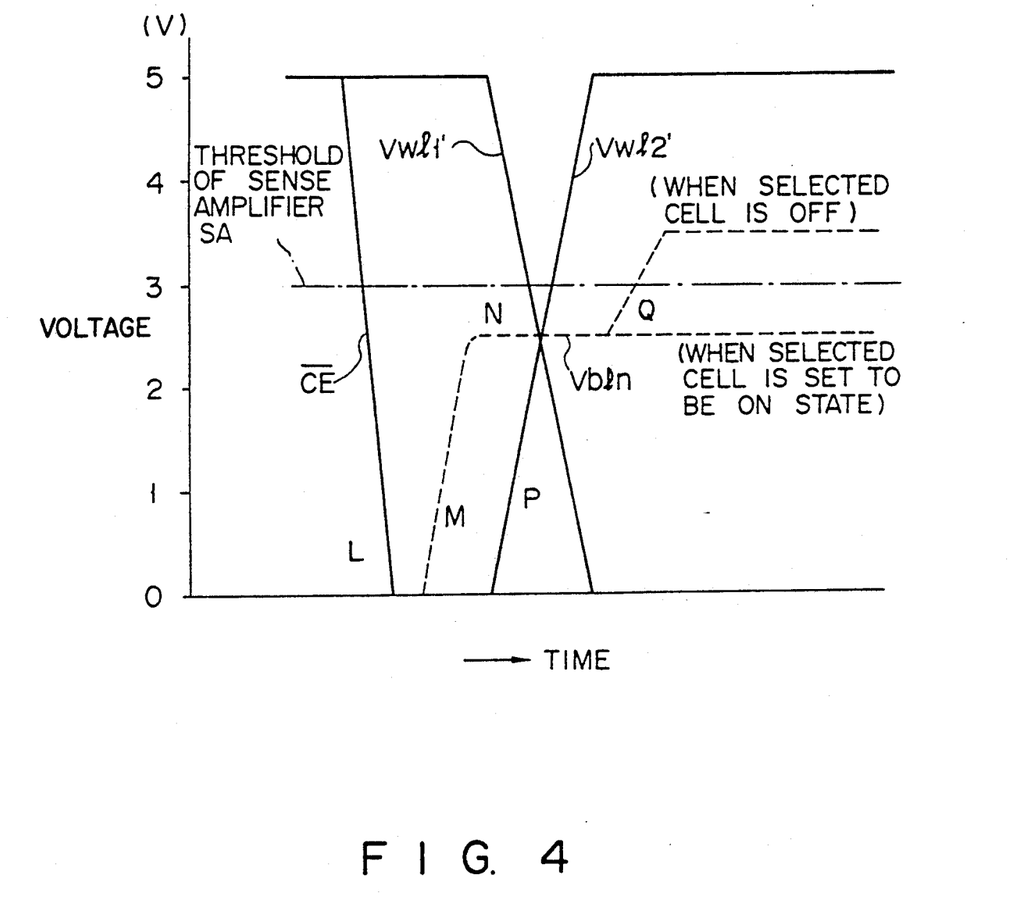
FIG. 4 is a graph showing a waveform of a read operation of the ROM in FIG. 3.

A read operation during a transition from a selected state to a non-selected state of the ROM is described below with reference to FIGS. 3 and 4.

When the ROM is used by connecting a computer system, in a non-selected state of the ROM (the n-channel MOS transistor QS is set in an OFF state), it is assumed that the column line BLn is selected. At the same time, the row line WL1 is selected, and thus the memory cell 1-1n is selected. In this state, since the dummy row line WLd is set in a selected state, the column line BLn is set at a ground potential by the dummy memory cell 1d-n set in an ON state.

Thereafter, it is assumed that the ROM chip is selected, and the row line WL2 is selected in place of the row line WL1. In this case, the same column line BLn is successively selected. Therefore, when the ROM chip is selected, the memory cell 1-2n is selected. At this time, the chip selection signal/CE is set at 0 V (L in FIG. 4), thereby turning on the n-channel MOS transistor QS. Therefore, a charging current is supplied to the selected column line BLn, and a potential Vbln of the column line BLn begins to increase (M in FIG. 4).

The row lines WL1 to WLm and the dummy row line WLd are usually made of polysilicon or a polycide. Therefore, the row selection signal on the row lines WL1 to WLm is delayed by resistance and capacitance components of the row lines, and a potential Vwl2' on the column line BLn side rises after that on the column line BL1 side (P in FIG. 4). In this case, since the transition from a selected state to the non-selected state of the dummy cell 1d-n connected to the column line BLn is similarly delayed as described above, the potential Vbln of the column line BLn is held at low level and is not transiently set in a floating state. That is, the potential Vbln of the column line BLn is not erroneously charged to be high level (N in FIG. 4). Thereafter, when the cell 1-2n connected to the same column line BLn is selected, the dummy cell 1d-n is substantially simultaneously set in the non-selected state, thereby preventing disturbance of a selection operation for the memory cell 1-2n. Therefore, the potential Vbln of the column line BLn is set at low or high level according to storage data of the selected memory cell 1-2n (Q in FIG. 4).

Figure 5:
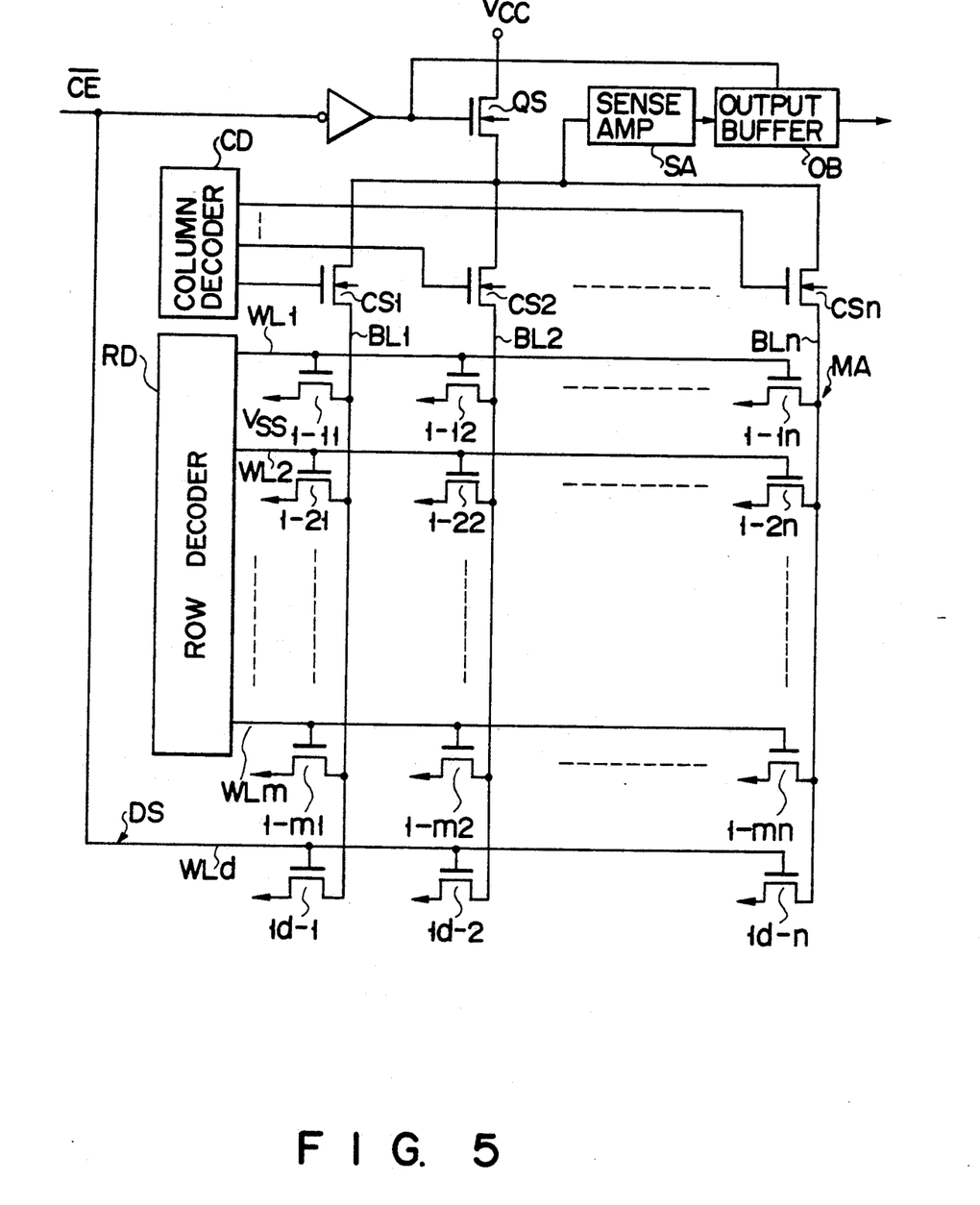
FIG. 5 is a view for explaining a part of an arrangement of a ROM according to the second embodiment of the present invention.

FIG. 5 is a view showing the second embodiment of the present invention. A dummy row selector DS is a lead wire for transmitting a chip selection signal $\overline{CE}$ to the dummy row line.

Figure 6:
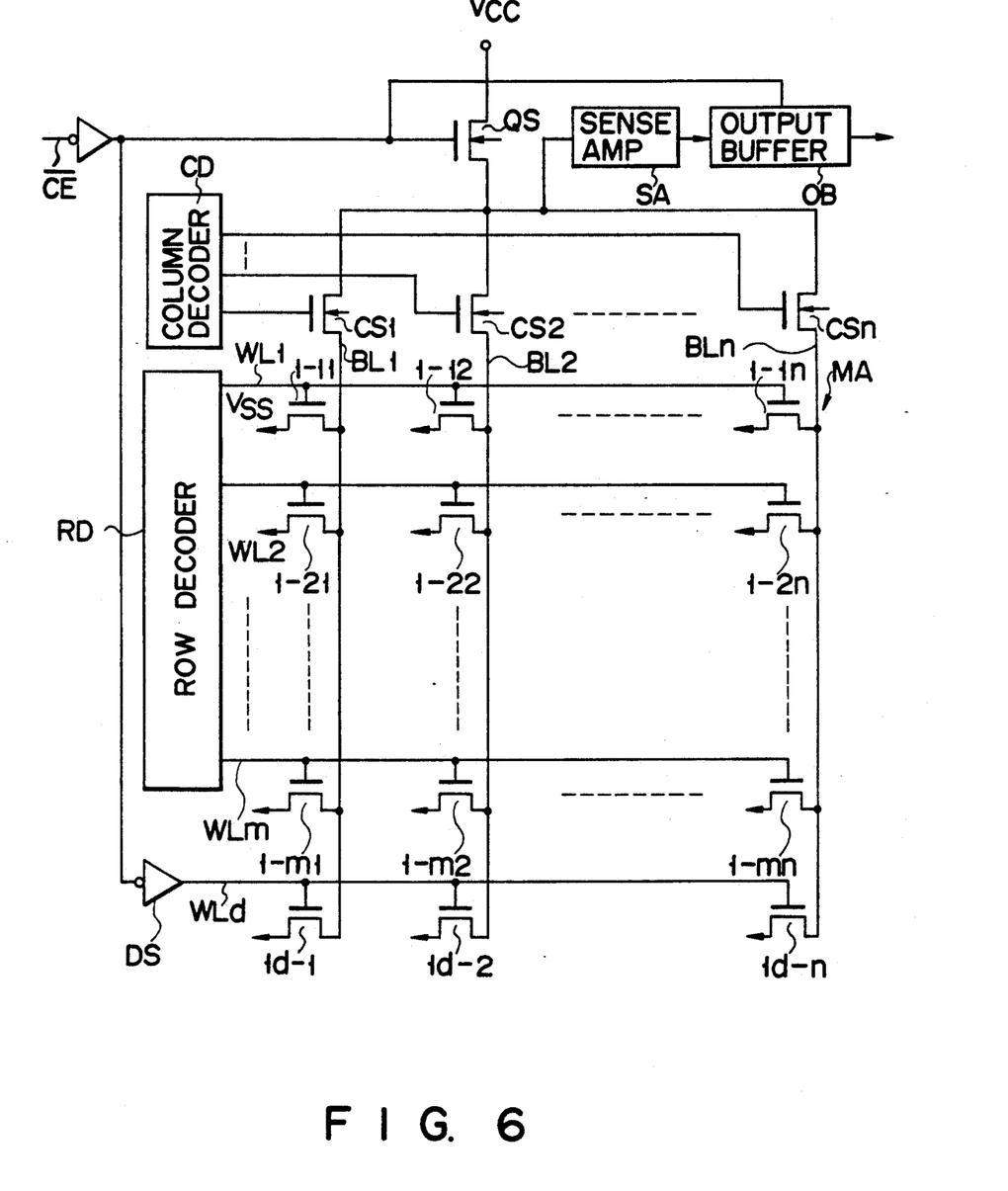
FIG. 6 is a view for explaining a part of an arrangement of a ROM according to the third embodiment of the present invention.

FIG. 6 is a view showing the third embodiment of the present invention. A dummy row selector DS is an inverter, to which a positive logic chip selection signal/CE is input, for inverting the chip selection signal and outputting it to a dummy row line WLd.

Therefore, in the ROM, since a dummy row line and dummy cells are selected when a ROM chip is not selected, each of the column lines is set at low level by a dummy memory cell set in an ON state. During a transition from the non-selected state to the selected state of the ROM chip, in synchronism with the transition from the non-selected state to the selected state of a target memory cell selected from a plurality of memory cells, the state of the dummy cell connected to the drain of the selected memory cell transits to the non-selected state. Therefore, since a potential of a target row line is held at the ground potential until the target memory cell is actually selected, the target column line is prevented from being transiently set in a floating state. In addition, since the dummy cell is set in the non-selected state upon selection of the memory cell, the present invention does not prevent a memory cell selection operation. Therefore, since a potential of a column line connected to the selected memory cell is set at low or high level according to storage data of the memory cell from the ground potential, a glitch of level "1"→level "0"→level "1" does not occur in the read data output.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A non-volatile semiconductor memory device, comprising:
    a plurality of non-volatile memory cells for storing binary data arranged in a row and column matrix, each of said memory cells having a control electrode and first and second current terminals, said first current terminal of each of said memory cells connected to a ground potential;
    column lines respectively connected to the second current terminals of memory cells;
    row lines having a propagation delay determined by a resistance and a capacitance of a material from which said row lines are formed and respectively connected to the control electrodes of said memory cells;
    a decoder responsive to address data for selecting one of the memory cells by applying a selection signal to the row line coupled to the memory cell corresponding to the address data;
    dummy memory cells each having a control electrode and first and second current terminals, said dummy memory cells arranged such that the first current terminal of each dummy memory cell is connected to the ground potential and the second terminal of each dummy memory cell is connected to one of said column lines, said dummy memory cells arranged to be set in an ON state upon being selected;
    a dummy row line connected to the control electrodes of said dummy memory cells and having a propagation delay equal to that of said row lines; and
    dummy row line selector means for selecting said dummy row line for a period in which said memory device is not selected by a chip selection signal for selecting said memory device,
    wherein a time at which a row selection signal propagating on a row line reaches one of said memory cells, thereby selecting said one of said memory cells, and a time at which a signal propagating on said dummy row line reaches the dummy cell coupled to the same column line as said one of said memory cells, are substantially the same.

2. The device according to claim 1, wherein said dummy row line has the same shape as said row line.

3. The device according to claim 1, wherein said dummy row line is made of the same material as said row line.

4. The device according to claim 1, wherein said dummy row line selector means is a lead wire for transmitting said chip selection signal to said dummy row line.

5. The device according to claim 1, wherein said dummy row line selector means is a buffer amplifier, into which said chip selection signal is input, for current-amplifying said chip selection signal and outputting the current-amplified chip selection signal to said dummy row line.

6. The device according to claim 1, wherein said dummy row line selector means is an inverter, into which said chip selection signal is input, for inverting said chip selection signal and outputting the inverted chip selection signal to said dummy row line.

7. The device according to claim 1, wherein said dummy cells have the same structure as said non-volatile memory cells.

8. The device according to claim 1, wherein said non-volatile memory cells comprise non-volatile memory cell transistors.

9. A non-volatile semiconductor memory device, comprising:
   a plurality of non-volatile memory cell transistors arranged in a row and column matrix, each of said memory cell transistors having a control electrode and first and second current terminals, said first current terminal of each of said memory cell transistors coupled to a first reference potential;
   column lines respectively coupled to the second current terminal of memory cell transistors in a column of said matrix;
   row lines having a propagation delay determined by a resistance and a capacitance of a material from which said row lines are formed and respectively coupled to the control electrode of memory cell transistors in a row of said matrix;
   a decoder responsive to address data for selecting a memory cell by applying a selection signal to the row line coupled to the memory cell corresponding to the address data;
   a read/write enabling circuit responsive to a first level of an enable signal for enabling reading and writing of data to the memory cell transistors;
   dummy memory cell transistors each having a control electrode and first and second current terminals, said dummy cell memory transistors arranged such that the first current terminal of each dummy memory cell transistor is coupled to a respective column line and the second current terminal of each dummy memory cell transistor is coupled to the first reference potential;
   a dummy row line, having a propagation delay equal to that of said row lines, on which a dummy row selection signal is propagated and which is coupled to the control electrode of each dummy memory cell transistor; and
   a dummy row line selector responsive to the first level of the enable signal for switching OFF the dummy memory cell transistor coupled to the same column line as an address memory cell transistor substantially simultaneously with an application of the selection signal to the addressed memory cell transistor.

10. The non-volatile semiconductor memory device according to claim 9 wherein the first reference potential is ground potential.

11. The non-volatile semiconductor memory device according to claim 9 wherein said dummy row line is composed of the same material as said row lines such that a time constant for signals applied to said row lines and said dummy row line are substantially the same.

12. The non-volatile semiconductor memory device according to claim 11 wherein said dummy row line selector is further responsive to a second level of the enable signal for switching ON said dummy memory cell transistors to set said column lines at a second reference potential.

13. The non-volatile semiconductor memory device according to claim 12 wherein the second reference potential is ground potential.

14. The non-volatile semiconductor memory device according to claim 11 wherein said dummy row line selector means includes a lead wire for transmitting the enable signal to said dummy row line.

15. The non-volatile semiconductor memory device according to claim 11 wherein said dummy row line selector means includes a buffer amplifier for receiving and amplifying the enable signal and outputting the amplified signal to said dummy row line.

16. The non-volatile semiconductor memory device according to claim 11 wherein said dummy row line selector means includes an inverter for receiving and inverting the chip enable signal and outputting the inverted signal to said dummy row line.

* * * * *